United States Patent Office 3,366,499

Patented Jan. 30, 1968

3,366,499

COMBINATION ETCHING RESIST AND SOLDERING FLUX COMPOUND

Arthur Liebscher, Jenkintown, Pa., assignor to Electronics Inc. of Pennsylvania, Willow Grove, Pa., a corporation of Pennsylvania No Drawing. Filed July 7, 1965, Ser. No. 470,240
4 Claims. (Cl. 106—237)

ABSTRACT OF THE DISCLOSURE

This invention concerns a flux resist composition comprising in parts by weight as applied:

100–150 of rosin,
16–25 of clay, and
70–120 of solvent, and a method for its use. The solvent is employed in selected amounts to provide cream consistency to the composition so that it is readily and effectively applied. The flux resist of this invention serves a three fold purpose. It is, at the same time, an etching resist, a protective coating for the metallic surface it covers and a solder flux. The invention, therefore, provides a single composition to perform three functions. The present invention is ideally suited for screen printing on copper clad insulating base materials to form printed-wiring circuits. The flux resist composition of this invention does not require removal and cleaning operations between etching and soldering processes, thereby effecting an added advantage in time and economy.

This invention relates to a multipurpose compound which performs as a novel etching resist, a metallic surface protector and a soldering flux. It is ideal for screen printing on copper clad insulating base materials to form printed-wiring circuits. Unlike conventional resists, this flux resist compound does not require removal and cleaning operations between etching and soldering processes.

In making basic printed-wiring panels, there is employed a base of suitable insulating material in sheet form and clad with a conductive metal foil or film, such as that of copper. To produce an etched circuit panel, it is customary to imprint the circuit pattern on the foil-clad panel with an acid-resistant material called a resist. The panel is then treated with an acid solution which etches away the unprotected portions of the metal foil. The remaining portions of the foil form the desired conductor pattern. The components of the circuit, such as transistors, condensers, and the like, are then arranged in proper location on the panel followed by structural and electrical connection thereto by a soldering operation of either dip, wave or manual type, as desired. One such method is described in U.S. Patent No. 2,872,625.

The material used as the insulating base can be of organic, inorganic or composite origin. Typical insulating bases include phenolic impregnated paper and glass fiber reinforced epoxy resin sheets. Plastic panels are easy to handle and prepare in desired shapes and forms.

The metal foil or film is bonded to the insulating panel by a technique known to the art, such as with suitable adhesives. Copper is the preferred metal because of satisfactory cost, good electrical conductivity and enhanced soldering characteristics.

The ultimate circuit lines of foil are protected during the etching process by a resist composed of materials impervious to acids but generally not conductive to soldering. In most instances, by known art methods, it is necessary, for good soldering results, to remove the resist, such as by washing with a suitable solvent prior to the soldering operation. No such hindrance is required in the method of the present invention. Furthermore, in the mass production of printed circuit panels wherein the resist has to be removed, as is the general rule with the known methods, frequently considerable periods of time elapse between the steps of removing the resist and subsequent soldering. The longer the interval of time, the greater the oxidation on the exposed copper or other metal surface. This oxidation requires a cleaning operation prior to the application of the flux and the soldering. In addition, the mere fact that the resist has to be removed increases the time, labor and cost required to produce the finished product. Here again, no such extra step is needed or desired in the method of the present invention.

Some of the several objects of this invention are to provide a durable multipurpose product that is commercially appealing by virtue of time, labor and cost-saving characteristics and to provide a method employing said product in which metal-oxidation, usually copper-oxidation, is substantially nonexistant.

It should, of course, be understood that the description herein is illustrative merely and that various modifications and changes can be made in the methods and embodiments herein set forth without departing from the spirit of the invention.

The resist may be deposited on the metal foil or film by any convenient method. Conventional silk-screen techniques are preferably used, in which the acid resist is applied, usually by means of a squeegee, onto the metal through a silk screen having significant portions of its mesh plugged or blocked off in the form of the desired pattern.

After the resist has been applied, it may be dried, if desired, in a hot air oven or preferably by means of a group of lamps, such as those of the infrared type. These methods although requiring careful temperature control, usually achieve drying in a matter of minutes, such as five minutes. If time is not critical, drying of the resist may be effected at room temperature for periods of about 12 to 24 hours.

After the resist is dry, the panel may be etched according to any of the known methods, such as acid etching. The panel may be etched relatively promptly after the resist has been dried or after any period of storage occasioned by production schedules. The dried resist employed in this invention, to be fully described hereinafter, inherently possesses resistance to the known etchants. When etching the pattern, it is desirable to use etching machines operating at a temperature of approximately 120 degrees Fahrenheit for about 3 minutes when one ounce copper is used with ferric chloride as the etchant.

After the etching process is concluded, the etchant resist coating is left on the board. In a preferred embodiment, the components of the electronic circuit or circuits, as the case may be, are applied to the insulating base side of the etched circuit panel. Properly placed holes, drilled or punched through the panel, permit suitable electrical leads to be passed through the panel for subsequent soldering to the metal surface of the panel. Since the resist employed in this invention is also a solder flux, the soldering operation is readily consummated, employing the conventional solders, such as those of tin and lead in various proportions, the most suitable being about 63% tin.

Previous attempts to produce a compound capable of encompasing all of the above qualities, have been fraught with etching difficulties in that incoherent resist surfaces resulted in pin holes, cracks or chipped areas which should have been completely protected from the etchant. Previous formulations also encountered difficulties in soldering where oil-based inks, paints or stains contaminated the metal surface to a point of interference with good solder wetting. Pin holes in copper lines or areas, which are masked by a resist during the etching process, commonly result from bubbles in flux resist. The flux compound described in this invention is self-correcting by virtue of the fact that the gasses causing the bubbles are dissipated as the compound dries. This is achieved by the adsorption qualities of a drying agent which is an inert ingredient of the flux compound. It will be apparent to those skilled in the art that the etchant resistant coating employed in this invention and having the necessary properties for a solder flux may logically be termed a flux resist. Such a term properly emphasizes the outstanding attribute of this invention.

The flux resist comprises in parts by weight:

rosin—100 to 150, preferably 110 to 135
clay—16 to 25, preferably 18 to 22 and, in the form of a cream or paste as applied, solvent—70 to 120 with the amount of solvent employed being determined by the requirements for the desired viscosity of the paste or cream. A particularly effective formulation comprises in parts by weight:

| | |
|---|---|
| Rosin | 120 |
| Kaolin | 19 |
| Mineral spirits | 75 |

The rosin term employed is to be construed as including any of the known rosins, such as gum rosin, wood rosin, tall oil rosin and the like. Also included are hydrogenated, partly hydrogenated and dehydrogenated rosin and rosin modified by reaction in known manner, such as with maleic anhydride. Also contemplated are the acids obtainable from rosins as the principal components thereof, such as abietic acid, necabietic acid, levopimaric acid, dihydroabietic acid, dehydroabietic acid and the like, as well as esters of these rosin acids with monohydric or polyhydric alcohols, such as methyl abietate, ethyl abieate, glycerol abietate, pentaerythritol abietate and alcohols derived from the rosin acids by reduction of the carboxyl group, such as abietyl alcohol and pimaryl alcohol. If desired, small plasticizing amounts of plasticizer may be used with the rosin, such as dibutyl phthalate, dicotyl phthalate, diamyl phthalate, and others. Preferred embodiments of this component of the flux resist are the commercially available types of rosin of the natural gum or wood rosin types, particularly those that have been purified to be light in color, approaching colorlessness.

The solvent is defined with respect to the rosin and typically includes mineral spirits, benzene, toluene, xylene, chlorobenzene, methanol, butanol, octanol and ethylene glycol.

The clay contemplated may be any of the naturally occurring hydrous aluminum silicates.

These include the montmorillonite group, such as montmorillonite, saponite, nontrionite and hectorite; the kaolin group, such as kaolinite and macrite; the hydrous mica group, such as glauconite; and other clays not belonging to any of the above groups, such as chlorite, vermiculite and attapulgite. It is quite possible and permissible to use a mixture of clays, if desired, and frequently commercial supplies do contain more than one type of clay. Kaolin is the preferred clay to the present purpose of stabilizing the flux resist and providing a substantially homogenous paste or cream. The clay, as well as the rosin, is prepared in a small particle size, preferably finely comminuted to a powdery or pulverulent condition. In such particle size, the flux resist is readily prepared according to standard procedures.

The flux resist is prepared by first heating the rosin unitl it melts. This occurs in the temperature range of about 200° to 350° F., and above, depending on the particular rosin employed and the time allotted to the process. The solvent is then heated to a predetermined temperature below its boiling point and specifically depending on the particular solvent employed. The solvent and molten rosin are combined with stirring. The solution is then cooled or, if time is not particularly critical, allowed to stand and thereby cool to preferably below about 100° F. down to normal room temperature. The clay is then added slowly and incrementally, while the system is agitated, as by stirring. From prior formulations and applications, one skilled in the art will be able to calculate readily the amount of solvent, in the defined range, that should be used to provide satisfactory consistency for the present method. The flux resist is then ready for use according to conventional application procedures with satisfactory setting and drying, but no smearing, cracking or flaking. The flux resist performs advantageously during the etching operation and decomposes desirably during the soldering procedure so that a valuable printed circuit is prepared in which there is no current leakage or short circuiting during the use of the printed circuit.

In addition to the numerous advantages previously set forth, the present flux resist is fluorescent under ultra violet light of short wave length, such as about 2,500 A. This useful characteristic facilitates inspection, in that the ultra light response of the flux resist creates a considerable contrast on the circuit panel enabling the inspector to make a rapid check on workmanship without fear of injury to the eyes.

Due to the importance of cleanliness and in particular freedom from oxidants such as cuprous oxide, cupric oxide, or hydrogen sulphide in achieving reliable and uniformly smooth solder wetting on copper surfaces, it is necessary to either clean the copper immediately before soldering or to preserve initial cleanliness through presoldering processes.

As previously mentioned, conventional etching procedures require stripping of resist after etching and then a cleaning and drying operation. This leaves the surface of the copper exposed through handling, storage and transportation periods. In order to prevent severe oxidization some commercial producers use a thin coat of flux over the entire etched side of the panel.

Where no attempt is made to preserve the copper surface cleanliness, deoxidizing is more often accomplished just prior to solder wetting by strong acid or alkaline activators in various flux preparations. Some produce violent gassing and even spatter residues upon surrounding objects. If such fluxes, with strong activators, are boiled or otherwise caused to penetrate through component lead holes some such activators may become deposited on components where, unless thoroughly removed, they can become a corrosion hazard.

The present invention presents a well preserved clean surface to the soldering operation because the copper surface can be cleaned before printing and maintained in the same state through etching, handling, storage and assembly periods.

Various methods of cleaning copper surfaces before printing may be based on chemical, abrasive or friction scrubbing. It has been found highly satisfactory to clean the surface of the copper by chemically etching it to a level below the maximum penetration of all surface accumulated oxides.

This can be accomplished by immersing the panel in a solution of ammonium persulphate for approximately 12 seconds, followed immediately by a thorough rinse of clean cold water to stop the chemical action.

The rinse can also be completed in about 12 seconds, after which the surface should be dried without delay.

This can be done by such methods as heating the panel a few seconds in 200 degree F. water and then right after withdrawal, blasting off the water film with forced clean air.

Immediately thereafter a temporary preservative in the form of extremely dilute rosin in alcohol should be applied and instantly dried. The surface is thus protected until coated with flux resist. Improper solution or excessive coating may hamper etching. A perfectly clean panel should have a uniformly distributed porous or frosted appearance of light reddish-brown copper. Application of the temporary protective coat may produce a slightly darker shade. Although the temporary protective coat is transparent, its presence is necessary to insure sealing the raw clean copper against air oxidization until the flux resist provides a more substantial and a more durable protective coating over the permanent circuit pattern.

Even though the flux resist in the compound heretofore described is inert and free of any activator, various amounts of activators can be added to suit commercial requirements. Strong activators are not required because of the well preserved copper surface.

In a typical method of application, where an inert flux resist is employed, circuit panels with components mounted are refluxed on the circuit side by gently brushing a thinned coat of mildly activated flux over the flux resist and all component leads. Where flux of a mild activation type is used, there is no need to remove any residue since electrical leakage readings should prove excellent high resistance in the order of thousands of megohms between circuits.

I claim:

1. A flux resist composition which in condition for use is substantially water insoluble consisting essentially of in parts by weight as applied:

100 to 150 of rosin,
16 to 25 of clay, and
70 to 120 of a volatile organic solvent, said solvent being employed in selected amounts to provide cream consistency to said flux resist.

2. A flux resist composition according to claim 1 wherein said rosin is gum rosin and said clay is kaolin.

3. A flux resist composition according to claim 1 wherein said rosin is wood rosin and said clay is kaolin.

4. A flux resist composition which in condition for use is substantially water insoluble consisting essentially of in parts by weight as applied:

100–135 of rosin,
18–22 of clay, and
70–120 of volatile organic solvent, said solvent being employed in selected amounts to provide cream consistency to said flux resist composition.

References Cited

UNITED STATES PATENTS

| | | | |
|---|---|---|---|
| 2,271,691 | 3/1942 | Grasshof | 106—241 |
| 2,695,351 | 11/1954 | Beck | 156—13 |
| 2,592,546 | 4/1952 | Dirkman | 156—13 |
| 2,089,571 | 8/1937 | Polaski | 156—13 |
| 358 | 8/1837 | Coyle | 106—241 |

FOREIGN PATENTS

| | | |
|---|---|---|
| 569,385 | 1/1959 | Canada. |

JULIUS FROME, *Primary Examiner.*